United States Patent
Linz

(10) Patent No.: US 7,260,490 B2
(45) Date of Patent: Aug. 21, 2007

(54) METHOD FOR MEASURING A DELAY TIME OF A DIGITAL CIRCUIT AND CORRESPONDING DEVICE AND DIGITAL CIRCUIT

(75) Inventor: Stefan Linz, Sauerlach (DE)

(73) Assignee: Infineon Technologies, Inc., Munich (DE)

( * ) Notice: Subject to any disclaimer, the term of this patent is extended or adjusted under 35 U.S.C. 154(b) by 72 days.

(21) Appl. No.: 11/215,057

(22) Filed: Aug. 30, 2005

(65) Prior Publication Data
US 2006/0048041 A1    Mar. 2, 2006

(30) Foreign Application Priority Data
Aug. 31, 2004  (DE)  ............... 10 2004 042 079

(51) Int. Cl.
*G01R 29/02* (2006.01)
(52) U.S. Cl. ............... 702/79; 702/80; 702/89; 713/401
(58) Field of Classification Search .......... 702/79, 702/80, 89; 327/156, 261, 263, 291–298; 713/401; 714/724, 733, 815
See application file for complete search history.

(56) References Cited

U.S. PATENT DOCUMENTS

| | | | |
|---|---|---|---|
| 3,836,756 A * | 9/1974 | Yammoto et al. ............ 318/602 |
| 4,345,241 A * | 8/1982 | Takeuchi et al. ............ 341/118 |
| 5,517,155 A * | 5/1996 | Yamauchi et al. .......... 331/1 A |
| 5,942,902 A | 8/1999 | Okayasu |
| 6,184,753 B1 * | 2/2001 | Ishimi et al. ................. 331/34 |
| 6,658,581 B1 * | 12/2003 | Takahashi et al. .......... 713/401 |
| 6,715,118 B2 | 3/2004 | Kaiser |
| 6,956,422 B2 * | 10/2005 | Reilly et al. ................. 327/261 |
| 6,993,672 B2 * | 1/2006 | Takahashi et al. .......... 713/401 |

FOREIGN PATENT DOCUMENTS

| | | |
|---|---|---|
| DE | 196 52 890 C2 | 7/1997 |
| DE | 198 45 409 A1 | 4/2000 |
| DE | 100 06 236 C2 | 9/2001 |
| EP | 0 994 361 A2 | 4/2000 |

* cited by examiner

*Primary Examiner*—Carol S. W. Tsai
(74) *Attorney, Agent, or Firm*—Brinks Hofer Gilson & Lione

(57) ABSTRACT

In a method and device measuring a delay time of a section of a digital circuit, an output signal of the section is saved in different memory locations with a clock and earlier by a time interval with respect to the clock, different durations being assigned to the time interval. The delay time is determined as a function of the greatest of the different durations during which a test proceeds in a positive manner. The test proceeds in a positive manner if the value saved with the clock corresponds with the value saved so as to be earlier by the corresponding time interval.

35 Claims, 1 Drawing Sheet

METHOD FOR MEASURING A DELAY TIME OF A DIGITAL CIRCUIT AND CORRESPONDING DEVICE AND DIGITAL CIRCUIT

PRIORITY CLAIM

This application claims the benefit of priority to German Patent Application 10 2004 042 079.3 filed on Aug. 31, 2004, herein incorporated by reference in its entirety.

TECHNICAL FIELD

The present invention relates to a method for measuring a delay time (running time) of a section of a digital circuit and to a correspondingly constructed device which, in particular, can be arranged within the digital circuit, and to a corresponding digital circuit.

BACKGROUND

To investigate delay time behavior of a digital circuit, various devices are used, apart from expensive test devices located outside of the digital circuit. One device usually arranged within the digital circuit is based on a ring oscillator of inverting cells which are constructed using the same technology as the digital circuit to be evaluated. A rough assessment of the delay time behavior can be given by way of measurements at the ring oscillator. However, this circuit provides only a rough assessment of the delay time behavior, and thus does not directly measure the delay time behavior of a section of the digital circuit that is to be determined but can only indirectly make a statement about the delay time behavior of the overall digital circuit.

In the other technique, an analog-digital converter (ADC) is used to examine a wave form of a critical signal of the digital circuit. While the delay time behavior of a section of the digital circuit can be directly investigated, such a technique is very expensive as well as taking up a large portion of valuable real estate of the digital circuit.

SUMMARY

By way of introduction only, a method for measuring a delay time of a section of a digital circuit is provided. An output signal of the section is supplied to a memory element of the digital circuit and is saved with a clock in the memory element. The output signal is saved in a further memory element of the digital circuit, so as to be earlier by a time interval than that saved corresponding to the clock. Different durations are assigned to the time interval, the delay time of the section being determined as a function of the greatest (longest) of these different durations during which a test proceeds in a positive manner. A test result is deemed positive if the value saved with the clock in the memory element corresponds to the value of the output signal saved earlier by the corresponding time interval.

The method thus checks whether an output of the section to be investigated with respect to its delay time behavior already has a correct value before this value is taken over into the memory element using a system clock of the digital circuit. It is also determined by how much earlier or by what duration earlier, based on when the value is saved into the memory element by the clock, the output already has the correct value, in other words, the test is proceeding in a positive manner. The delay time of the section may then be determined, for example, by subtraction of a period of the clock with the greatest duration. The time interval during execution of the test is kept constant over a period of the clock.

To check whether the time interval already has the correct value at the output to the section it is not usually sufficient to check, for example, for only one clock period whether the previous value of the time interval of the output is equal to the value which is taken over into the memory element by means of the clock. Therefore, in one embodiment the time interval is kept constant over a plurality of clock periods. During this time it is checked whether, in each case, the time interval already has the correct value at the output to the section. In other words, whether the test is proceeding in a positive manner is determined.

A respective penultimate value of the output signal can also be saved in in yet another memory element of the digital circuit. The penultimate value is the value which is saved in the memory element one clock period beforehand. In the process, the test proceeds in a positive manner only if sub-tests executed over a specific number of clock periods proceed in a positive manner and during a time during which the test is executed none of these sub-tests proceeds in a negative manner. In this case, a sub-test is deemed positive if the penultimate value and the value of the saved output signal are different and, at the same time, a memory content of the memory element and the value of the saved output signal correspond to each other. A sub-test is negative if a memory content of the memory element and the value of the saved output signal do not correspond to each other.

A sub-test is thus only deemed positive if the output signal has changed its value. If the output signal retains its value over a clock period (i.e. there is no difference between the penultimate value and the current value of the output or the output signal), the value at the output of the section can be picked off a clock period beforehand (and not just the time interval beforehand), without a sub-test or thus a test detecting a negative result. Thus, in one embodiment, only sub-tests in which there is a difference between the penultimate value and the current value of the output are evaluated as positive. The test is positive by demanding that not just one sub-test but a number of sub-tests has to proceed in a positive manner without a sub-test proceeding in a negative manner in the process.

In one example, a test can be evaluated as positive if, for each 1 bit output of the section, a specific number of sub-tests proceeds in a positive manner and, during execution of a test, none of these sub-tests proceeds in a negative manner. In this case, a sub-test is deemed positive if the penultimate value of the corresponding 1 bit output has the value 0, the memory content of the memory element corresponding to the corresponding 1 bit output has the value 1, and the value of the respective 1 bit output saved earlier also has the value 1. In this case, a sub-test is deemed negative if the value of the corresponding 1 bit output saved earlier does not correspond with the memory content of the memory element corresponding to the corresponding 1 bit output.

According to this embodiment, the number of sub-tests is composed of the first number and the second number. The first number indicates how many sub-tests have to proceed in a positive manner per 1 bit output if a rising edge last occurred at this 1 bit output. The second number similarly indicates how many sub-tests per 1 bit output have to proceed in a positive manner if a falling edge last occurred at this 1 bit output. If the first or second number is set, for example, to 64,000, it is ensured that, per 1 bit output, it was checked 64,000 times, for both a rising edge and a falling edge, that a value saved in advance by the time interval is equal to the corresponding memory content of the memory element. In other words, the test proceeded in a positive manner. In such a case it is extremely likely that the memory element can also be operated with a clock period which is shorter than the time interval without the digital circuit malfunctioning as a result.

In one embodiment, in a device for measuring a delay time of a section of a digital circuit, an output of the section is connected to a first memory element, which is clocked with the clock. The output of the section is also connected to a data input of a second memory element. An output of the controller is connected to a clock input of the second memory element. Outputs of the first and second memory elements are provided to the controller.

The controller loads a clock input of the second memory element with a specific clock which is delayed by the time interval with respect to the clock such that the specific clock comes before the clock by a time interval. The controller sets the time interval to different durations and ascertains the greatest or longest duration at which a test executed by the control means proceeds in a positive manner. A test is deemed positive if the controller compares values of the outputs of the first and second memory elements and does not determine a difference. In addition, the controller outputs the greatest duration ascertained in this manner.

In one embodiment, the device can comprise a third memory element clocked with the clock. The output of the first memory element is connected to the data input of the third memory element. An output of the third memory element is supplied to the controller. The device is thus capable of saving the respective penultimate value of the output signal.

In addition, the controller can comprise a delay circuit and a controller, the clock being connected to an input of the delay circuit and an output of the delay circuit being connected to the clock input of the second memory element. In this case, the controller and the delay circuit may control the delay circuit to generate a specific clock in that the delay circuit delays the clock by the time interval.

The delay circuit can also comprise a specific number of delay elements and multiplexers. A chain of any desired quantity of these delay elements can be connected between the input and the output of the delay circuit with the aid of the multiplexers. This chain means that the specific clock is delayed with respect to the clock by a time interval which is determined by adding up delay times of the delay elements in the chain.

The quantity of delay elements can be determined for the chain by the controller and with the aid of the delay circuit. This leads to a delay which corresponds to the clock period of the clock. As a result it is possible to output the greatest duration determined by the device in relation to this clock period or to specify the time interval to the device as this relationship, wherein the device checks whether the section of the digital circuit is still operating correctly (the test is proceeding in a positive manner) if the output of the section is saved a time interval before the clock.

The controller can be constructed from a control unit and a plurality of evaluation units. In this case, each evaluation unit evaluates one output signal, whereas the control unit controls all evaluation units.

In another embodiment, a digital circuit comprises a section, a memory element clocked with a clock of the digital circuit and the device described above for measuring the delay time of the section. The control unit can in this case be arranged outside of the digital circuit and, for example, be an extension of a JTAG (Joint Test Action Group) module which is used for controlling a boundary scan.

The foregoing summary has been provided only by way of introduction. Nothing in this section should be taken as a limitation on the following claims, which define the scope of the invention.

BRIEF DESCRIPTION OF THE FIGURE

The invention is described in more detail below on the basis of exemplary embodiments with reference to the drawing.

DETAILED DESCRIPTION

Figure 1:
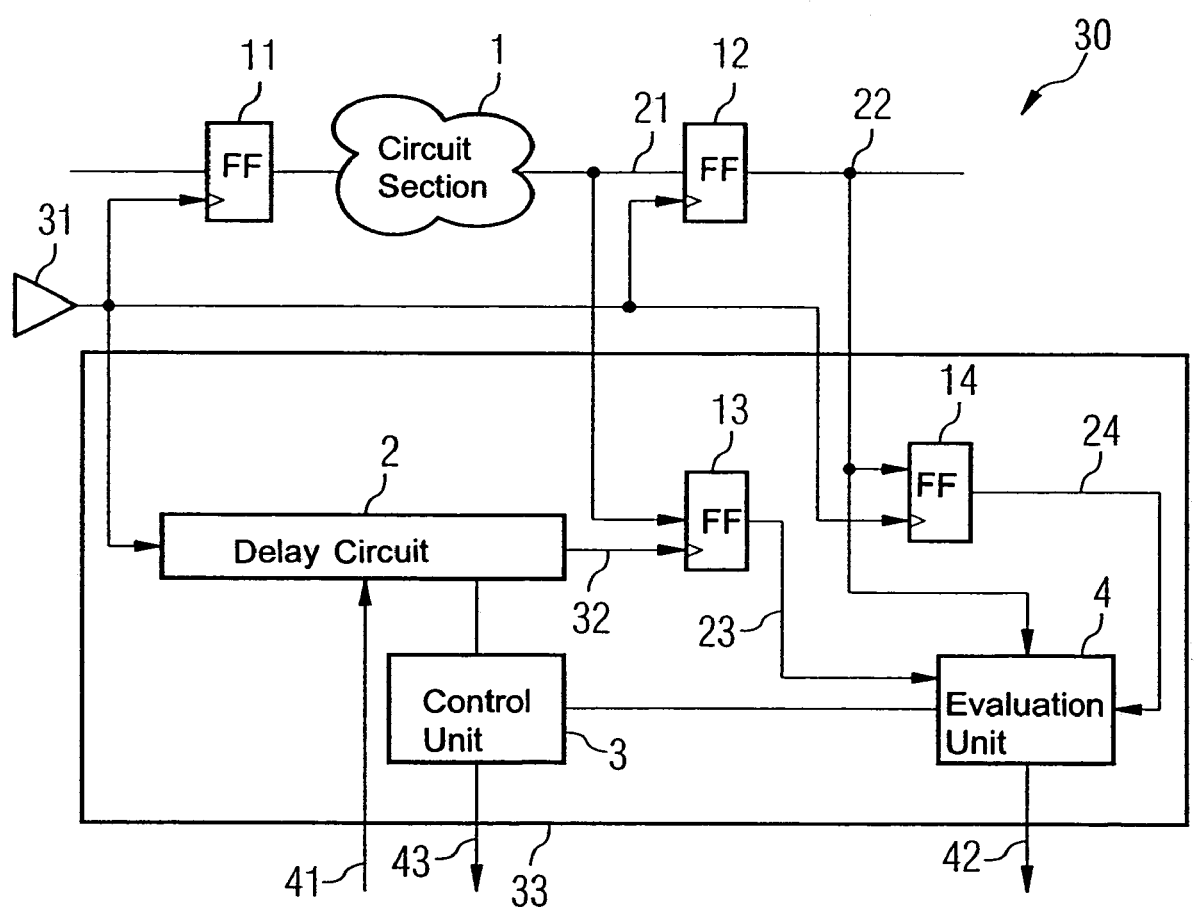
FIG. 1 illustrates a digital signal according to one embodiment.

The digital circuit 30 shown in the FIGURE comprises a circuit section 1, an input flip-flop 11, a first flip-flop 12 and a device 33 for measuring a delay time of the circuit section 1. This device 33 in turn comprises a delay circuit 2, a control unit 3, an evaluation unit 4 and a second flip-flop 13 and a third flip-flop 14.

An output of the input flip-flop 11 is connected to an input of the circuit section 1. An output 21 of the circuit section 1 is connected to a data input of the first flip-flop 12 and a data input of the second flip-flop 13. An output 22 of the first flip-flop 12 is connected to a data input of the third flip-flop 14 and to an input of the evaluation unit 4. Similarly, an output 23 of the second flip-flop 13 and an output 24 of the third flip-flop 14 are connected to inputs of the evaluation unit 4. A system clock 31 of the digital circuit 30 is connected to a clock input of the input flip-flop 11, the first flip-flop 12, the third flip-flop 14 and to an input of the delay circuit 2. A clock input of the second flip-flop 13 is, by contrast, connected to an output 32 of the delay circuit 2. The control unit 3 is connected to the delay circuit 2 and to the evaluation unit 4.

The mode of operation of the digital circuit 30 or the device 33 is as follows:

With each active edge of system clock 31, a value at the input of the input flip-flop 11 is loaded into the input flip-flop 11 and thus also saved in the circuit section 1. This subsequently possibly leads to a change in a value of the output 21 of the circuit section 1 corresponding to a delay time of the circuit section 1 (if the value at the input of the input flip-flop 11 before the rising edge of the system clock 31 corresponds to a value at the output of the input flip-flop 11 at this instant, this can, for example, lead to there being no change in the value of the output 21 of the circuit section 1). If a period of the system clock 31 is longer than the delay time of the circuit section 1, the changed value of the output 21 of the circuit section 1 is loaded into the first flip-flop 12 at the next rising edge of the system clock 31 and is thus present at the output 22. This is the normal mode of operation of the digital circuit 30, the device 33 not playing any part in this case.

A phase of the system clock 31 is delayed by the delay circuit 2. It is assumed in the present embodiment that the system clock 31 is delayed by the delay circuit 2 such that at the output 32 there is a specific clock at which the active edge comes so as to be earlier by a time interval compared with the system clock 31. The value of the output 21 is thus taken over into the second flip-flop 13 so as to be earlier by the time interval than this value is taken over into the first flip-flop 12. The evaluation unit 4 accordingly checks whether the value saved in the first flip-flop 12 corresponds to the value saved in the second flip-flop 13. If this is the case, the clock periods of the system clock 31 can be reduced by the time interval without this changing the mode of operation of the digital circuit 30.

Of course it is not sufficient to perform this comparison only once in order to make a corresponding statement. As the delay time of the circuit section 1 depends on many factors, for example on input values and a state of the circuit section 1, at a specific time interval, usually several thousand of these comparisons lead to a positive result before such a statement can be made.

A comparison of this type is also only meaningful if the value of output 21 has changed. The value of output 22 is therefore saved in the third flip-flop 14 and likewise made available to the evaluation unit 4 via output 24. The evaluation unit 4 is accordingly configured such that it checks whether the value of output 22 corresponds to the value of output 24. Only if these two values do not correspond, in other words there was a change in the value of output 21 during the last clock period, is the value of output 22 compared with the value of output 23 and, in the event of consistency, evaluated as a positive sub-test. Only if a number of positive sub-tests is greater than 64,000, without a single negative sub-test having occurred in the process, is a test evaluated as being positive and indicated to the control unit 3. For the control unit 3, this means that the system clock period can be reduced by the time interval set during the sub-tests without changing the function of the digital circuit.

A result of a respective sub-test is output via an output 42 of the evaluation unit 4.

The control unit 3 accordingly gradually changes the time interval with the aid of the delay circuit 3 and checks with the aid of the evaluation circuit whether the test is proceeding positively. The control unit 3 thus approaches a duration at which the test is still just proceeding in a positive manner. This duration indicates by how much the system clock periods can be reduced without a fault occurring in the mode of operation of the digital circuit 30. The control unit 3 outputs this duration via an output 43 in a relationship to the clock periods of the system clock 31 being applied.

A time interval can be specified via an input 41 to the delay circuit 2. In this case, the control unit 3 checks with the aid of the evaluation unit 4 whether the time interval so specified leads to a positive test, a result of this test subsequently being output via the output 43.

The embodiment thus described has multiple uses. For example, the performance of components of digital circuits changes with increasing age. This usually leads to the components becoming slower. Thus, aging of the digital circuit can also be detected. Aging of the digital circuit leads to malfunctioning of the digital circuit owing to the poorer performance of the components. By periodically checking delay times of different sections of the digital circuit, deterioration in these delay times can be detected. As a result, a digital circuit operator can be informed of the aging and can replace the corresponding digital circuit.

In addition, a voltage supply to the digital circuit can be optimized. For example, as the delay time of the section of the digital circuit is usually shorter the higher the supply voltage to the digital circuit, the voltage supply can be reduced as long as the greatest duration at which the investigated section of the digital circuit is still operating correctly (the test is proceeding in a positive manner) is greater than a previously determined threshold such as zero. If the threshold is zero and the greatest duration is greater than this threshold, no difference in the mode of operation of the section is detected, or the test is proceeding in a positive manner, even if the outputs of the section of this greatest duration are scanned or saved before the actual system clock. In other words, the section is still operating correctly even at the correspondingly reduced voltage, so an attempt can be made to reduce the voltage supply even further.

Similarly, a threshold voltage of transistors of the digital circuit can be reduced to minimize stray currents. Both the reduction in the voltage value of the supply voltage and the minimization of the stray currents ensure that the digital circuit uses less power or less energy without the mode of operation of the digital circuit being adversely affected, while the clock period or a clock frequency of the digital circuit to be derived from the clock period is unchanged.

Alternatively, the delay time of the digital circuit can be optimized. In this case, the supply voltage to the digital circuit can be increased, starting from a voltage value at which the digital circuit reliably operates correctly, until the greatest duration is greater than a predetermined threshold.

As the clock periods at which the section of the digital circuit is still just operating correctly can be determined via the greatest duration, the clock frequency of the digital circuit at which the section is still just operating correctly can also be determined via this greatest duration. If the predetermined threshold is selected such that when the greatest duration is greater than this predetermined threshold, a target clock frequency of the digital circuit is achieved, the voltage value of the supply voltage can be set to be just greater than this predetermined threshold, so the digital circuit can be operated with the target clock frequency.

A deviation or a difference between a calculation of the delay time and a measurement of the delay time can also be determined. By outputting the greatest duration ascertained or measured, or the delay time derived therefrom, for example by an indication in relation to a clock period of the system clock of the digital circuit, this measured value can be compared with a value which, for example, has been determined by a circuit simulation. The circuit simulation can be optimized by this comparison.

A device, in particular a test device that measures the delay time of the section of the digital circuit can also be calibrated. The delay time of the digital circuit section measured may be used to aid in calibrating a test device with which, for example, further digital circuits that are identical in terms of construction can be checked.

It is also possible to specify the time interval to use the method to check whether the test proceeds in a positive manner during the specified time interval, in other words whether the section of the digital circuit also operates faultlessly when the data at the output of the section is picked off a time interval earlier.

A hold problem in the digital circuit section can also be checked. In this case, the values of the output of the section are saved so as to be later by the time interval with respect to the clock, the greatest duration being determined at which the time interval can be set without a difference from the values of the output saved with the clock being detected, in other words the test proceeds in a positive manner.

As indicated, the delay time of any desired section of the digital circuit is directly measured while using a small space. Thus, the embodiment is suitable for monitoring or measuring the delay time of one or more section(s) of a microelectronic or other digital circuit. The entire embodiment can be arranged in the circuit, or partially or completely outside of the circuit.

In various other embodiments, one or more output signals of the section can be used. Similarly, the time interval may be kept constant for at least one period of the clock. One or more multiplexers and/or evaluation units can be used.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

The invention claimed is:

1. A method for measuring a delay time of a section of a digital circuit, the method comprising:
   supplying an output signal of the section to a first memory element of the digital circuit;
   saving the output signal in the first memory element with a clock;
   saving the output signal earlier than the clock by a time interval;
   determining whether a test proceeds in a positive manner, the test proceeding in a positive manner if a value saved with the clock in the first memory element corresponds to a value of the output signal saved earlier:
   assigning a different duration to the time interval;
   repeating the determination until the greatest of the different durations at which the test proceeds in a positive manner is determined.

2. The method according to claim 1, wherein the time interval is kept constant for a period of the clock and the test is executed over the period.

3. The method according to claim 1, wherein the output signal is saved earlier in a second memory element of the digital circuit.

4. The method according to claim 1, wherein:
   a penultimate value of the output signal is saved and corresponds to the value of the saved output signal during a clock period preceding a current clock period, and
   the test proceeds in a positive manner if sub-tests, which are executed over a specific number of clock periods, proceed in a positive manner and no sub-test proceeds in a negative manner during the specific number of clock periods, a sub-test proceeding in a positive manner if the penultimate value and the value of the saved output signal do not correspond and a memory content of the first memory element and the value of the saved output signal correspond, the sub-test proceeding in a negative manner if the penultimate value and the value of the saved output signal do not correspond and the memory content of the first memory element and the value of the saved output signal do not correspond.

5. The method according to claim 4, wherein the test proceeds in a positive manner if at least one of:
   (i) a specific first number of the sub-tests proceeds in a positive manner and during execution of the sub-tests no sub-test proceeds in a negative manner, a sub-test proceeding in a positive manner if the penultimate value of the respective output signal is 0 and the memory content of the first memory element corresponding to the output signal and the value of the output signal saved earlier are 1, a sub-test proceeding in a negative manner if the memory content of the first memory element corresponding to the output signal does not correspond with the value of the output signal saved earlier; or
   (ii) a specific second number of the sub-tests proceeds in a positive manner and during execution of the sub-tests no sub-test proceeds in a negative manner, a sub-test proceeding in a positive manner if the penultimate value of the respective output signal is 1 and the memory content of the first memory element corresponding to the output signal and the value of the output signal saved earlier are 0, a sub-test proceeding in a negative manner if the memory content of the first memory element corresponding to the output signal does not correspond with the value of the output signal saved earlier.

6. The method according to claim 1, wherein the digital circuit is a microelectronic circuit.

7. The method according to claim 1, wherein the clock is a system clock of the digital circuit.

8. The method according to claim 1, wherein the method is used to detect aging of the digital circuit.

9. The method according to claim 1, wherein the method is used for optimizing a voltage supply to the digital circuit.

10. The method according to claim 9, wherein, for optimizing the voltage supply, a voltage value of the supply voltage is avoided as long as the greatest duration is greater than a predetermined threshold.

11. The method according to claim 9, wherein, for optimizing the voltage supply, a threshold voltage of a transistor of the digital circuit is optimized with respect to a minimization of stray currents of the transistor when the transistor is non-conductive as long as the greatest duration is greater than a predetermined threshold.

12. The method according to claim 1, wherein the method is used for determining a difference between a calculation of the delay time and a measurement of the delay time.

13. The method according to claim 1, wherein the method is used for calibrating a device for measuring the delay time of the section of the digital circuit.

14. The method according to claim 1, wherein the method is used for optimizing the delay time of the digital circuit.

15. The method according to claim 14, wherein, for optimizing delay time behavior of the digital circuit, a voltage value of a supply voltage to the digital circuit at which the digital circuit operates correctly is increased until the greatest duration is greater than a threshold.

16. The method according to claim 14, wherein, for optimizing delay time behavior of the digital circuit, a threshold voltage of a transistor of the digital circuit is optimized with respect to a switching time of the transistor until the greatest duration is greater than a threshold.

17. The method according to claim 1, wherein the time interval is specified and the method checks whether the test is proceeding in a positive manner during the specified time interval.

18. The method according to claim 1, wherein the output signal is saved so as to be later by the time interval with respect to the clock, the delay time at which there is no hold problem being determined as a function of the greatest duration.

19. A device for measuring a delay time of a section of a digital circuit, the digital circuit containing a first memory element clocked with a clock and having a data input to which an output of the section is connected, the device comprising:
   a second memory element; and
   a control circuit configured to save a value of the output of the section in the second memory element when a specific clock is applied which is earlier by a time interval with respect to the clock and with which the control circuit loads the second memory element, the control circuit setting the time interval to different durations, wherein the control circuit determines delay time as a function of the greatest of the different durations and outputs the greatest duration at which a test executed by the control circuit is positive, the test being positive if the control circuit does not detect a difference between values of the first and second memory element.

20. The device according to claim 19, wherein the control circuit keeps the time interval constant over a period of the clock and executes the test over the period.

21. The device according to claim 19, wherein:
the digital circuit comprises a third memory element clocked with the clock,
the control circuit is configured to save a value of the first memory element in the third memory element when the clock is applied, and
the test is positive if sub-tests executed by the control circuit over a specific number of clock periods are positive and none of the sub-tests are negative over the specific number of clock periods, a sub-test being positive if the control circuit detects a difference between values of the first and third memory elements and does not detect a difference between values of the first and second memory elements, the sub-test being negative if the control circuit detects a difference between values of the first and third memory elements and detects a difference between values of the first and second memory elements.

22. The device according to claim 21, wherein the control circuit is configured such that the test proceeds in a positive manner if at least one of:
(i) a specific first number of the sub-tests executed by the control circuit is positive and, during execution of the sub-tests, none of the sub-tests executed by the control circuit are negative, a sub-test being positive if the control circuit detects the value of the third memory element as 0 and the value of the fir stand second memory elements as 1, a sub-test being negative if the control circuit detects that the value of the second memory element is not equal to the value of the first memory element, or
(ii) a specific second number of the sub-tests executed by the control circuit is positive and, during execution of the sub-tests, none of the sub-tests executed by the control circuit are negative, a sub-test being positive if the control circuit detects the value of the third memory element as 1 and the value of the first and second memory elements as 0, a sub-test being negative if the control circuit detects that the value of the second memory element is not equal to the value of the first memory element.

23. The device according to claim 19, wherein:
the control circuit comprises a delay circuit and a controller,
the clock is supplied to an input of the delay circuit,
an output of the delay circuit is connected to a clock input of the second memory element, and
the controller and the delay circuit are configured such that the controller controls the delay circuit to generate the specific clock by delaying the clock by the time interval.

24. The device according to claim 23, wherein the delay circuit has delay elements and a multiplexer, the delay elements and the multiplexer connected such that a chain of a desired quantity of the delay elements is connectable by the multiplexer, an input of a first delay element of the chain being connected to the input of the delay circuit and an output of a final delay element of the chain being connected to the output of the delay circuit.

25. The device according to claim 24, wherein the controller is configured to form a chain having a delay corresponding to a clock period of the clock.

26. The device according to claim 23, wherein the controller comprises a control unit and an evaluation unit that evaluates the output signal and is controlled by the control unit.

27. The device according to claim 19, further comprising an input via which the time interval is specified, the control circuit configured to check whether the test is proceeding in a positive manner during the specified time interval.

28. The device according to claim 27, wherein the device is configured such that the time interval is specified by indicating a relationship between the time interval and a period of the clock via the input.

29. The device according to claim 19, further comprising an output that outputs the greatest duration by indicating a relationship between the duration and a period of the clock.

30. A digital circuit comprising:
a first memory element clocked with a clock, an output of a section of the digital circuit being connected to a data input of the memory element; and
a device that measures a delay time of the section, the device containing:
a second memory element; and
a control circuit configured to save a value of the output of the section in the second memory element when a specific clock is applied which is earlier by a time interval with respect to the clock and with which the control circuit loads the second memory element, the control circuit setting the time interval to different durations,
wherein the control circuit determines delay time as a function of the greatest of the different durations and outputs the greatest duration at which a test executed by the control circuit is positive, the test being positive if the control circuit does not detect a difference between values of the first and second memory element.

31. The digital circuit according to claim 30, wherein the digital circuit is a microelectronic circuit.

32. The digital circuit according to claim 30, wherein the clock is a system clock of the digital circuit.

33. The digital circuit of claim 30, wherein:
the control circuit comprises a delay circuit and a controller, the clock is supplied to an input of the delay circuit,
an output of the delay circuit is connected to a clock input of the second memory element,
the controller and the delay circuit are configured such that the controller controls the delay circuit to generate the specific clock by delaying the clock by the time interval,
the controller comprises a control unit and an evaluation unit that evaluates the output signal and is controlled by the control unit, and
wherein the control unit is arranged outside of the digital circuit.

34. The digital circuit according to claim 33, wherein the digital circuit is a microelectronic circuit.

35. The digital circuit according to claim 33, wherein the clock is a system clock of the digital circuit.

* * * * *